US007283374B2

(12) United States Patent
Pedoeem et al.

(10) Patent No.: US 7,283,374 B2

(45) Date of Patent: Oct. 16, 2007

(54) GROW AS YOU GO EQUIPMENT SHELF

(75) Inventors: Albert Pedoeem, West Orange, NJ (US); Mahesh Mistry, Parsippany, NJ (US); Larry Fox, Nanuet, NY (US); Todd Roccoberton, Monroe, NY (US); Tom Chiodo, Oak Ridge, NJ (US); Willie Braun, Franklin Lakes, NJ (US); Stephen J. Brolin, Livingston, NJ (US); Steven Joseph Smith, Milford, PA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/048,873

(22) Filed: Feb. 3, 2005

(65) Prior Publication Data

US 2006/0171133 A1 Aug. 3, 2006

(51) Int. Cl.
*H05K 7/14* (2006.01)

(52) U.S. Cl. ...................... 361/796; 361/788; 361/778; 361/781; 361/785; 361/774; 361/81

(58) Field of Classification Search ................ 361/796, 361/788, 778, 781, 785, 774, 81
See application file for complete search history.

(56) References Cited

U.S. PATENT DOCUMENTS 4,498,717 A * 2/1985 Reimer ........................ 439/61
4,838,798 A * 6/1989 Evans et al. .................. 439/61
5,211,565 A * 5/1993 Krajewski et al. ............ 439/65
5,296,748 A * 3/1994 Wicklund et al. ........... 327/565
5,335,146 A * 8/1994 Stucke ....................... 361/785
5,546,273 A * 8/1996 Harris ........................ 361/697
5,907,475 A * 5/1999 Babinski et al. ............ 361/719
5,926,378 A * 7/1999 DeWitt et al. .............. 361/788
6,163,464 A * 12/2000 Ishibashi et al. ............ 361/788
6,344,975 B1 * 2/2002 Gayle ......................... 361/788
6,392,142 B1 * 5/2002 Uzuka et al. .............. 174/52.1
6,517,375 B2 * 2/2003 MacLaren et al. .......... 439/489
6,690,584 B2 * 2/2004 Uzuka et al. ............... 361/796
6,757,177 B2 * 6/2004 Harris et al. ................ 361/788
7,154,761 B1 * 12/2006 Camerlo et al. ............ 361/788
2002/0181215 A1 * 12/2002 Guenthner .................. 361/784
2003/0007339 A1 * 1/2003 Harris et al. ................ 361/788
2003/0161130 A1 * 8/2003 Yamamoto et al. ......... 361/796
2004/0010638 A1 * 1/2004 Crane, Jr. ................... 710/100
2004/0100783 A1 * 5/2004 Amit .......................... 361/796

* cited by examiner

*Primary Examiner*—Dean A. Reichard
*Assistant Examiner*—Hoa C Nguyen
(74) *Attorney, Agent, or Firm*—Bingham McCutchen LLP

(57) ABSTRACT

An extendable enclosure for circuit cards provides the capability for a customer to purchase a low cost system up-front, but still allow for growth. The extendable enclosure for circuit cards comprises a first enclosure comprising a backplane, a plurality of circuit card connectors, the backplane providing electrical connectivity among the plurality of circuit card connectors, a midplane connector mounted to the backplane, the midplane connector providing electrical connectivity to the backplane, and a backplane connector mounted to an edge of the backplane and providing electrical connectivity to the backplane and a second enclosure comprising a backplane, a plurality of circuit card connectors mounted to a face of the backplane, the backplane providing electrical connectivity among the plurality of circuit card connectors, and a backplane extension connector mounted to an edge of the backplane and providing electrical connectivity to the backplane, wherein the backplane extension connector is operable to plug into the backplane connector of the first component enclosure.

13 Claims, 6 Drawing Sheets

100
104
102
104
104
106
104
104

CORE + EXTENSION

GROW AS YOU GO EQUIPMENT SHELF

BACKGROUND OF THE INVENTION

1. Field of the Invention

The present invention relates to an enclosure for electronic circuit cards that provides modular expandability.

2. Description of the Related Art

As telecommunications networks expand, it is necessary to expand the networking equipment that supports such networks. Currently, customers are required to choose whether they want to spend more up-front and buy a larger system, which will leave room for future growth, or save on initial cost and buy a small system that is not expandable. When the need to expand a small system arises, the customer must purchase a separate system that requires its own common circuit cards (management and line units). The common circuit cards are often the bulk of the cost of a small system. In addition to having to spend more for the total system than if they had opted for a larger system to begin with, the customer must now manage multiple separate units rather than one.

An additional problem with current systems relates to the connectors on such systems. Current systems typically provide only one or two types of connectors pre-installed into the backplane. In order for a customer to use a different type of connector, they would have to purchase a different product entirely.

A need arises for a way for a customer to purchase a low cost system up-front, but still allow for growth without the need to purchase additional common circuit cards such as the management and line unit cards. In addition, a need arises for a way for a customer to utilize a variety of different connector types.

SUMMARY OF THE INVENTION

The present invention provides the capability for a customer to purchase a low cost system up-front, but still allow for growth without the need to purchase additional common circuit cards such as the management and line unit cards. This invention would reduce the initial investment cost by reducing the cost of BWB and shelf. The common circuit cards are often the bulk of the cost of a small system. Needing additional common cards for growth is a large price adder. Also, multiple systems means managing them each as a separate system. The expandable system would be managed by the customer's management software as one entity, which is a benefit to the customer.

The present invention provides the capability for a variety of customer connector types to be installed to the same shelf. Previously, to offer more than one type of connector, both types would need to be installed into the shelf BWB from the onset. The concept of having a board with connectors pluging into a mid-plane connector on the backside, allows one to customize the customer connector type using the same shelf without having the added cost of having all connector types installed from the outset.

In one embodiment of the present invention, a core component enclosure for circuit cards comprises a backplane, a plurality of circuit card connectors mounted to a face of the backplane, each circuit card connector operable to receive a circuit card, the backplane providing electrical connectivity among the plurality of circuit card connectors, a midplane connector mounted to the backplane, extending contact pins of at least one circuit card connector through a face of the backplane opposite to the face of the backplane to which the plurality of circuit card connectors are mounted, the midplane connector providing electrical connectivity to the backplane, and a backplane connector mounted to an edge of the backplane and providing electrical connectivity to the backplane.

In one aspect of the present invention, the core enclosure further comprises a pluggable board operable to plug into the midplane connector and having a plurality of connectors, the plurality of connectors including at least one of a plurality of different types of connectors. The edge-mounted backplane connector is operable to plug into a backplane extension connector in an extension component enclosure.

In one embodiment of the present invention, an extension component enclosure for circuit cards comprises a backplane, a plurality of circuit card connectors mounted to a face of the backplane, each circuit card connector operable to receive a circuit card, the backplane providing electrical connectivity among the plurality of circuit card connectors, and a backplane extension connector mounted to an edge of the backplane and providing electrical connectivity to the backplane, wherein the backplane extension connector is operable to plug into a backplane connector of a core component enclosure.

In one aspect of the present invention, the extension component enclosure further comprises a mating feature operable to mate the extension component enclosure to the core component enclosure. The mating feature comprises at least one of rotating latches operable to mate the extension component enclosure to the core component enclosure, guide pins operable to align extension component enclosure to the core component enclosure, and backplane alignment guides operable to align backplane extension connector of the extension component enclosure to the backplane connector of a core component enclosure.

In one embodiment of the present invention, an extendable enclosure for circuit cards comprises a first enclosure comprising a backplane, a plurality of circuit card connectors mounted to a face of the backplane, each circuit card connector operable to receive a circuit card, the backplane providing electrical connectivity among the plurality of circuit card connectors, a midplane connector mounted to the backplane, extending contact pins of at least one circuit card connector through a face of the backplane opposite to the face of the backplane to which the plurality of circuit card connectors are mounted, the midplane connector providing electrical connectivity to the backplane, and a backplane connector mounted to an edge of the backplane and providing electrical connectivity to the backplane; and a second enclosure comprising a backplane, a plurality of circuit card connectors mounted to a face of the backplane, each circuit card connector operable to receive a circuit card, the backplane providing electrical connectivity among the plurality of circuit card connectors, and a backplane extension connector mounted to an edge of the backplane and providing electrical connectivity to the backplane, wherein the backplane extension connector is operable to plug into the backplane connector of the first core component enclosure.

In one aspect of the present invention, the extendable enclosure further comprises a pluggable board operable to plug into the midplane connector and having a plurality of connectors, the plurality of connectors including at least one of a plurality of different types of connectors. The second enclosure further comprises a mating feature operable to mate the second enclosure to the first enclosure. The mating feature comprises at least one of rotating latches operable to mate the second enclosure to the first enclosure, guide pins operable to align second enclosure to the first enclosure, and backplane alignment guides operable to align the backplane extension connector of the second enclosure to the backplane connector of the first enclosure.

In one aspect of the present invention, circuit cards mounted in the first enclosure and circuit cards mounted in the second enclosure are managed as a single entity.

DETAILED DESCRIPTION OF THE PREFERRED EMBODIMENTS

The present invention provides an expandable enclosure for circuit cards that allows a customer to purchase a low cost system up-front, but still allow for growth without the need to purchase additional common circuit cards such as the management and line unit cards. The expandable system would be managed by the customer's management software as one entity, which is a benefit to the customer. The present invention provides the capability for a variety of customer connector types to be installed to the same enclosure.

Figure 1:
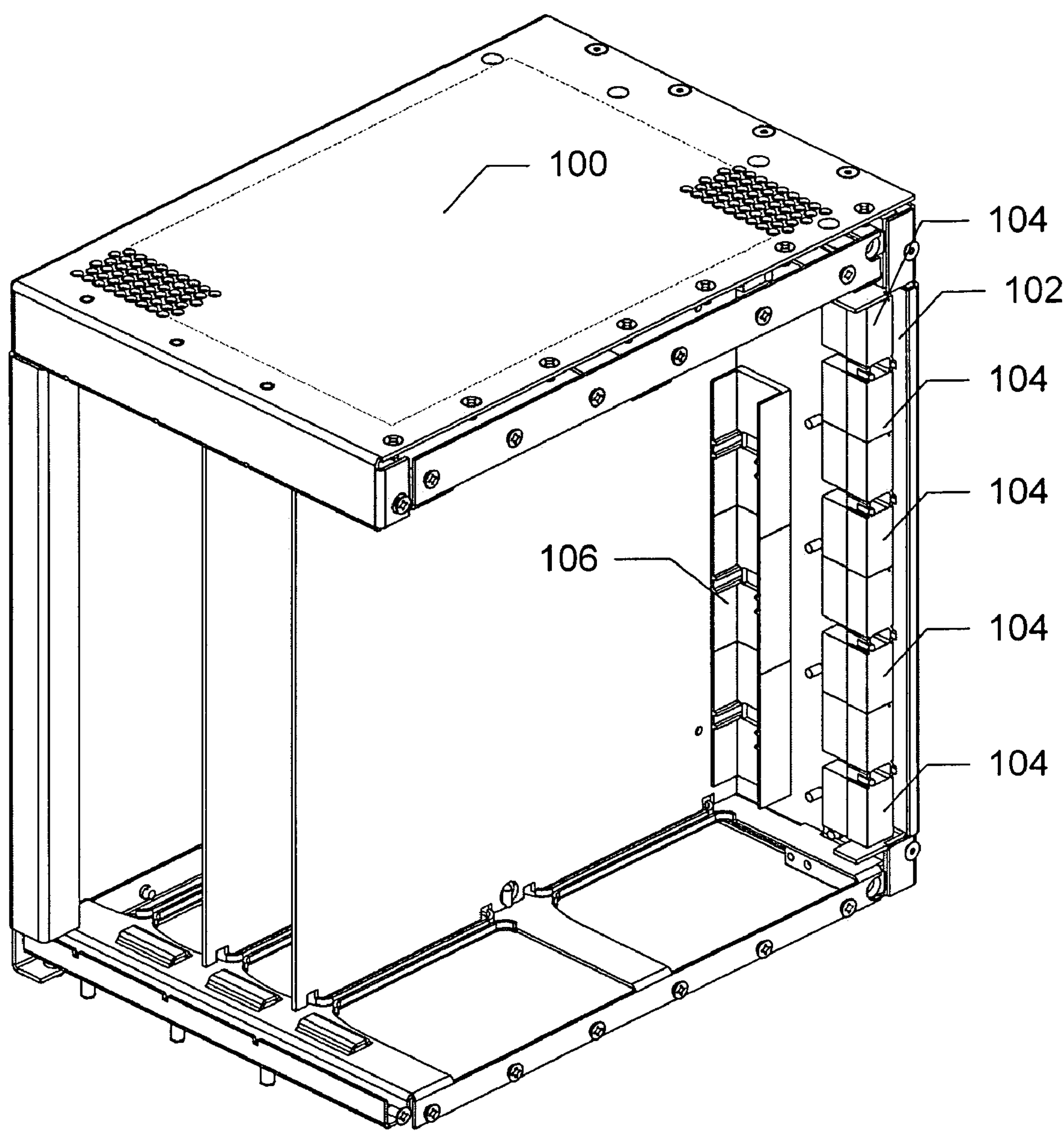
FIG. 1 is an exemplary diagram of a CORE component of an expandable enclosure, according to the present invention.

An example of a CORE component 100 of an expandable enclosure is shown in FIG. 1. FIG. 1 shows an interior view of CORE component 100 from the circuit card side. CORE component 100 has a small shelf backplane 102 with side-mate connectors 104 on one end, which is closed with a cover when the initial, CORE component 100 is first deployed. CORE component 100 has mid-plane connectors that are an extension of the circuit card connectors 106 on the front side of the backplane, with the contact pins extending through the backside of backplane 102. The use of mid-plane connectors allows direct access to the circuit card I/O without any additional routing/layers on the backplane. Pluggable boards with different connector types may be installed on the same base product depending on the customer's needs.

Figure 2:
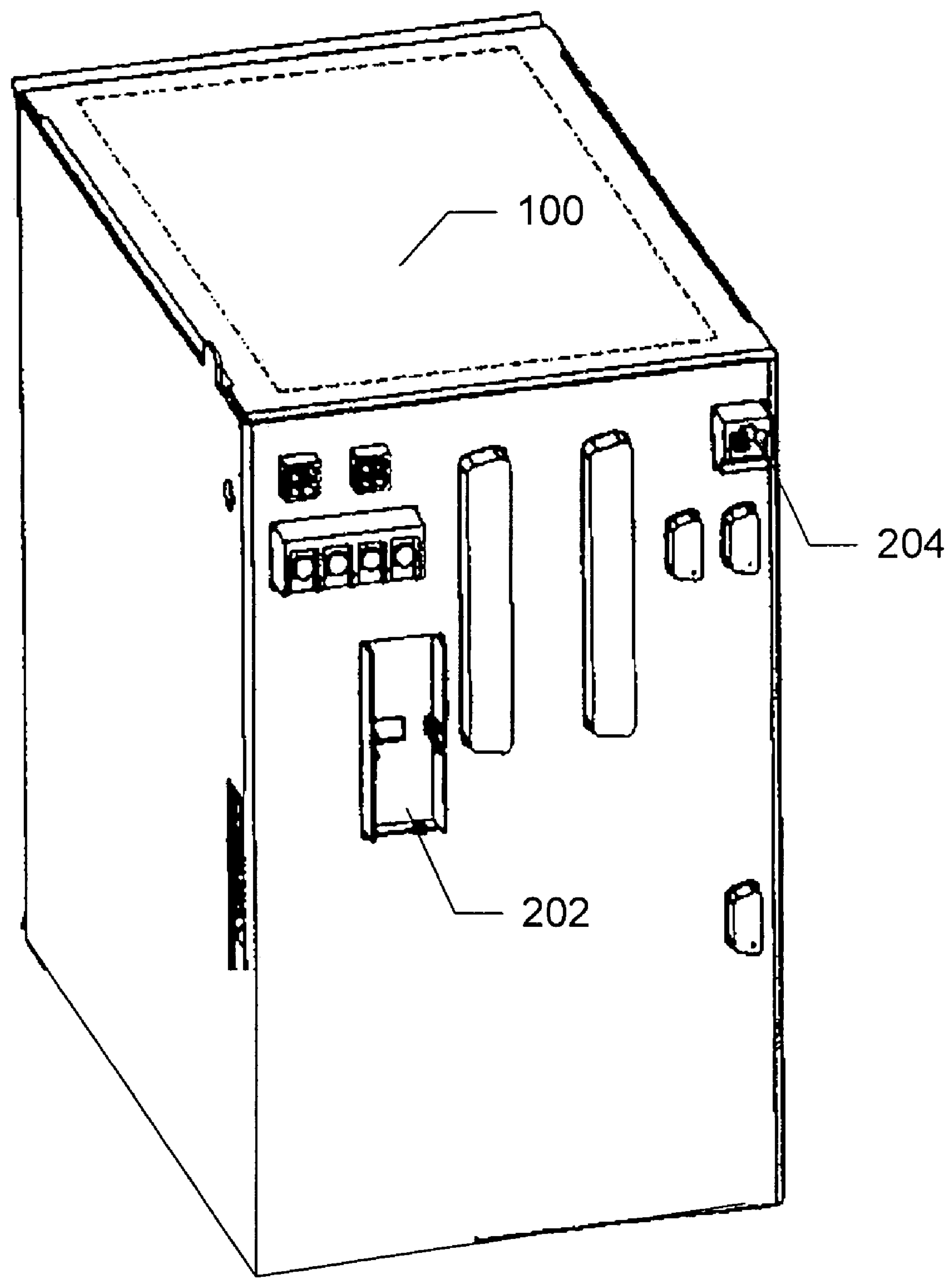
FIG. 2 is an exemplary diagram of an exterior view of a CORE component of an expandable enclosure, according to the present invention.

Turning now to FIG. 2, an example of an exterior view of CORE component 100 from the connector side is shown. CORE component 100 has mid-plane connectors 202 that are an extension of the circuit card connectors 106, shown in FIG. 1, on the front side of the backplane, with the contact pins extending through the backside of backplane 102. In addition, this side of CORE component 100 may include other connectors, such as power connector 204 and other electrical and/or optical connectors.

Figure 3:
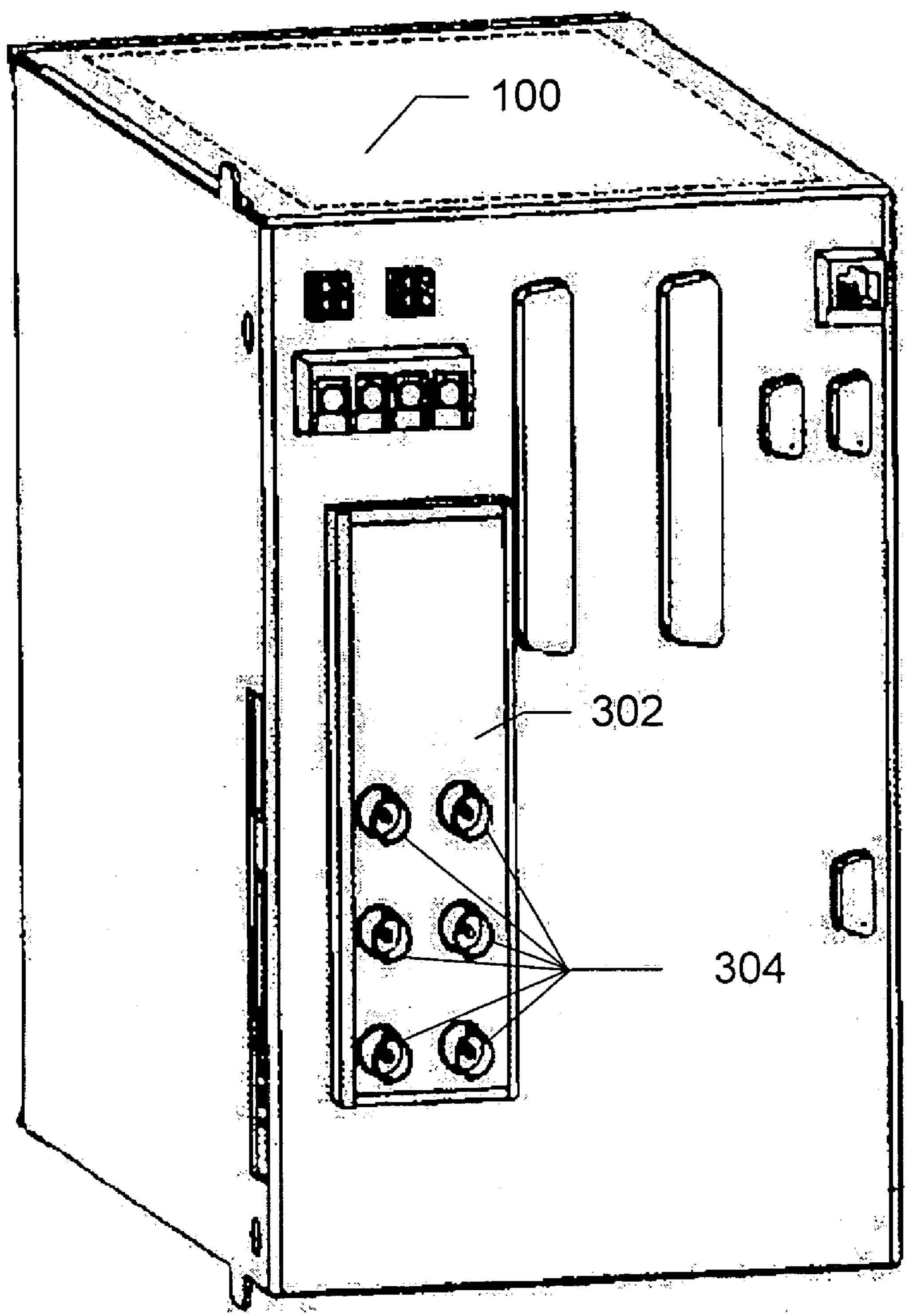
FIG. 3 is an exemplary diagram of an exterior view of a CORE component of an expandable enclosure, according to the present invention.

Turning now to FIG. 3, an example of an exterior view of CORE component 100 from the connector side is shown. The pluggable connector board 302 includes a plurality of connectors 304 and installs into mid-plane connectors 202, shown in FIG. 2, that are an extension of the circuit card connectors 106, shown in FIG. 1, in the backplane. The pluggable board may include one or more different types of external connectors, such as the BNC electrical connectors 304 that are shown or other types of electrical and/or optical connectors. Pluggable board 302 provides the capability to configure the same base CORE component 100 with different connector types depending on the customer's needs.

Figure 4:
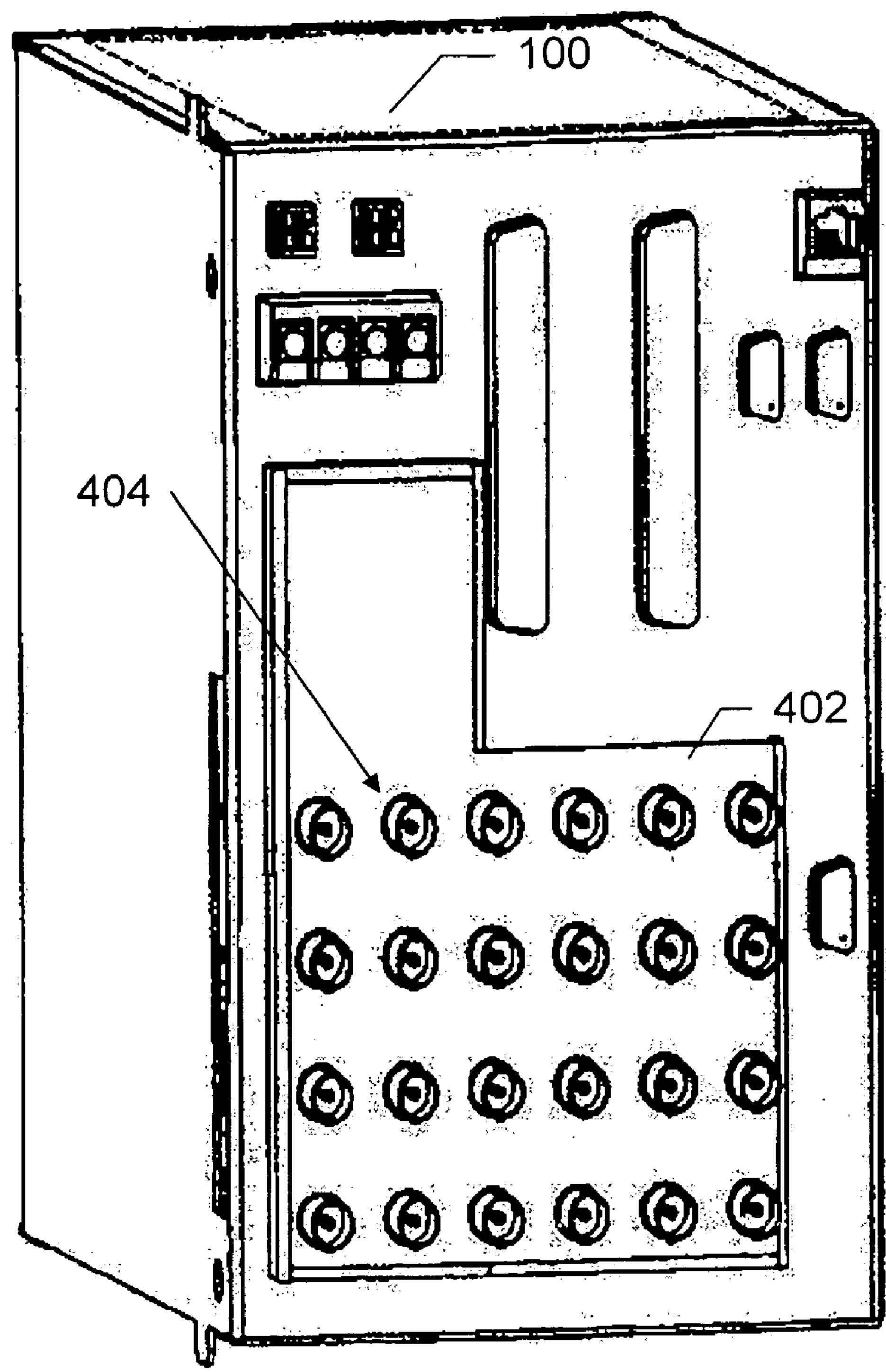
FIG. 4 is an exemplary diagram of an exterior view of a CORE component of an expandable enclosure, according to the present invention.

Another example of an exterior view of CORE component 100 from the connector side is shown in FIG. 4. The pluggable connector board 402 includes a plurality of connectors 404 and installs into mid-plane connectors 202, shown in FIG. 2, that are an extension of the circuit card connectors 106, shown in FIG. 1, in the backplane. The pluggable board may include one or more different types of external connectors, such as the BNC electrical connectors 404 that are shown or other types of electrical and/or optical connectors. Pluggable board 402 provides the capability to configure the same base CORE component 100 with different connector types depending on the customer's needs.

Figure 5:
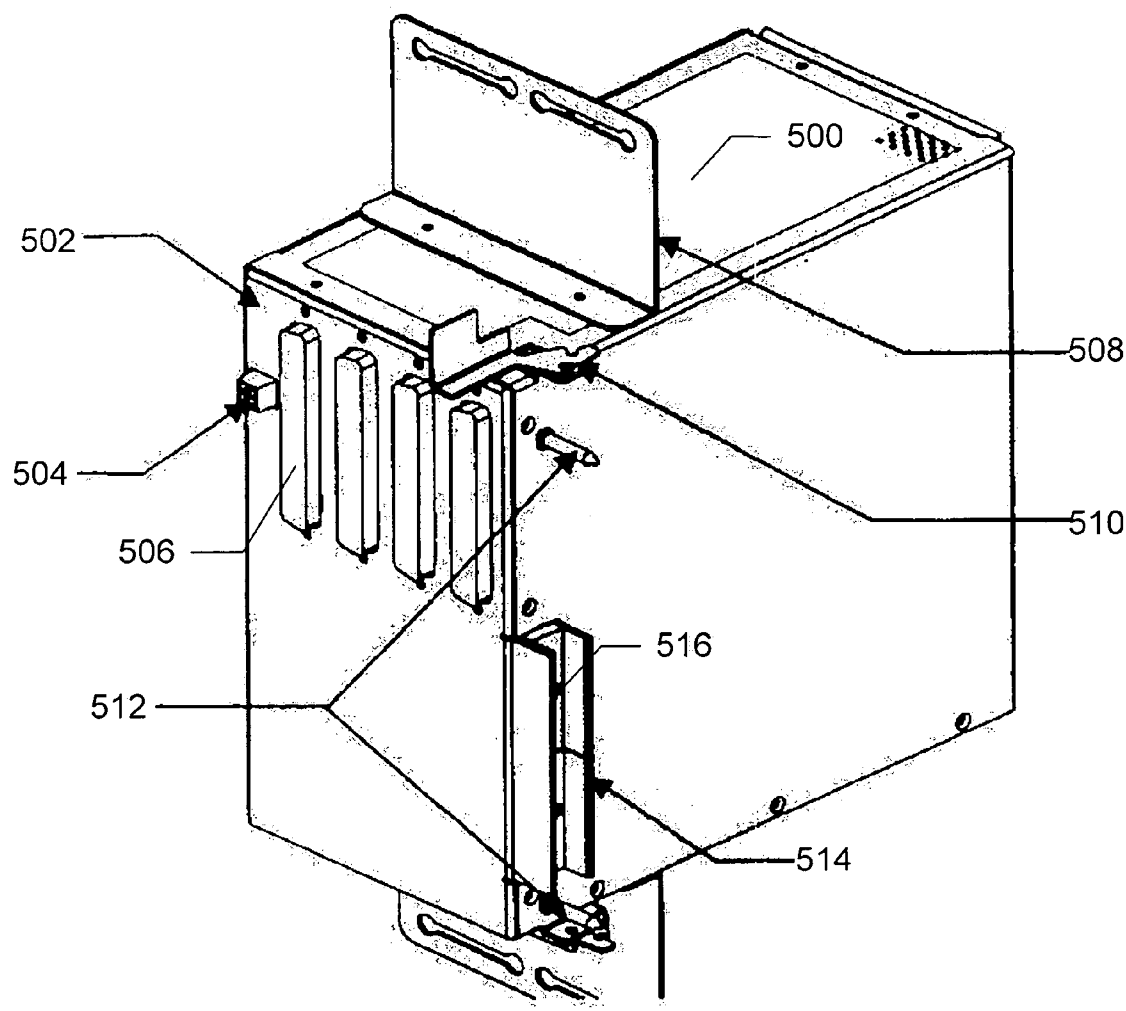
FIG. 5 is an exemplary diagram of an exterior view of an EXTENSION component of an expandable enclosure, according to the present invention.

Turning now to FIG. 5, an example of an exterior view of EXTENSION component 500 from the connector side is shown. EXTENSION component 500 has a backplane 502 including connectors, such as power connector 504 and signal connectors 506. EXTENSION component 500 may include mating features, such as mounting brackets 508, rotating latches 510, guide pins 512, and backplane alignment guides 514. Mounting brackets 508 provide the capability to mount EXTENSION component 500 in a rack, cabinet, etc. Rotating latches 510 provide the capability to mate CORE component 100 with EXTENSION components (not shown). Likewise, guide pins 512 provide easier alignment of EXTENSION component 500 with CORE component 100, while backplane alignment guides 514 provide alignment of backplane connectors 104 of CORE component 100 with mating connectors 516 in EXTENSION components.

Figure 6:
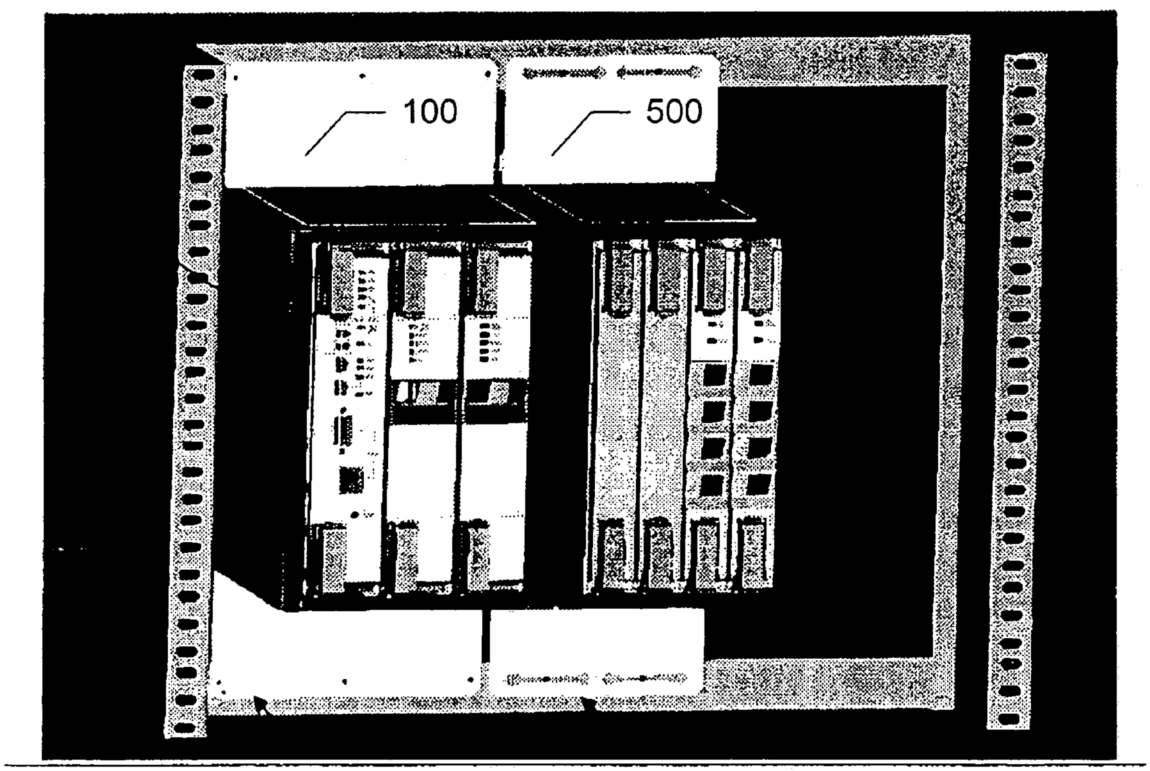
FIG. 6 is an exemplary diagram of a CORE component and an EXTENSION component of an expandable enclosure, according to the present invention.

When the customer needs to expand the services delivered from the system, an EXTENSION component 500 may be mated to the CORE component 100 by removing the side cover of backplane connectors 104 of CORE component 100 and mating the backplanes of the two components together, as shown in FIG. 6. An advantage of the EXTENSION component 500 is its flexibility in size. For example, the EXTENSION component 500 may be anywhere from 2-12 circuit card slots wide. In the example shown in FIG. 6, EXTENSION component 500 is four circuit card slots wide. Once mated, the backplanes act as a single large system, sharing the common circuit cards, for management and bandwidth access. The EXTENSION component added to the CORE component becomes "one" larger system offering expanded service capabilities.

Multiple sizes of EXTENSION components may be provided, such as sizes anywhere from 2 slots to 12 slots, or more, depending on the number of circuit cards required. This flexibility in size makes it easy to tailor the equipment to the need. Being one system offers management advantages.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A core component enclosure for circuit cards comprising:

a backplane having a backplane interior side and a backplane exterior side;

a plurality of circuit card connectors mounted to the backplane on the backplane interior side, each circuit card connector operable to receive a circuit card, the backplane providing electrical connectivity among the plurality of circuit card connectors;

a midplane connector, mounted to an exterior side of the core component enclosure, that is an extension of a circuit card connector on the backplane interior side, provides electrical connectivity to the backplane; and includes contact pins extending from the backplane interior side and through to the backplane exterior side to the midplane connector; and a backplane connector mounted to an edge of the backplane on the interior side and providing electrical connectivity to the backplane.

2. The enclosure of claim 1, further comprising:

a pluggable board operable to plug into the midplane connector and having a plurality of connectors, the plurality of connectors including at least one of a plurality of different types of connectors.

3. The enclosure of claim 1, wherein the backplane connector is operable to plug into a backplane extension connector in an extension component enclosure external to the core component enclosure.

4. The enclosure of claim 3, further comprising:

a pluggable board operable to plug into the midplane connector and having a plurality of connectors, the plurality of connectors including at least one of a plurality of different types of connectors.

5. An extension component enclosure for circuit cards comprising:

a backplane of the extension component enclosure having an interior side and an exterior side;

a plurality of circuit card connectors mounted to the backplane of the extension component on the interior side, each circuit card connector operable to receive a circuit card, the backplane of the extension component providing electrical connectivity among the plurality of circuit card connectors;

a backplane extension connector mounted to an edge of the backplane of the extension component and providing electrical connectivity to the backplane of the extension component, wherein the backplane extension connector is operable to plug into a backplane connector of a separate and external core component enclosure to share the plurality of circuit card connectors of the backplace of the extension component.

6. The extension component enclosure of claim 5, further comprising a mating feature operable to mate the extension component enclosure to the core component enclosure.

7. The extension component enclosure of claim 6, wherein the mating feature comprises at least one of:

rotating latches operable to mate the extension component enclosure to the core component enclosure;

guide pins operable to align extension component enclosure to the core component enclosure; and backplane alignment guides operable to align backplane extension connector of the extension component enclosure to the backplane connector of a core component enclosure.

8. An extendable enclosure for circuit cards comprising:

a first enclosure comprising:

a backplane having an interior side and an exterior side;

a plurality of circuit card connectors mounted to the backplane on the interior side, each circuit card connector operable to receive a circuit card, the backplane providing electrical connectivity among the plurality of circuit card connectors;

a midplane connector, mounted to an exterior side of the first enclosure, that is an extension of a circuit card connector on the backplane interior side, provides electrical the connectivity to the backplane;

contact pins extending from the backplane interior side and through to the backplane exterior side to the midplane connector; and a backplane connector mounted to an edge of the backplane and providing electrical connectivity to the backplane; and a second enclosure comprising:

a backplane, a plurality of circuit card connectors mounted to a face of the backplane, each circuit card connector operable to receive a circuit card, the backplane providing electrical connectivity among the plurality of circuit card connectors, and a backplane extension connector mounted to an edge of the backplane and providing electrical connectivity to the backplane, wherein the backplane extension connector is operable to plug into the backplane connector of the first component enclosure.

9. The extendable enclosure of claim 8, further comprising:

a pluggable board operable to plug into the midplane connector and having a plurality of connectors, the plurality of connectors including at least one of a plurality of different types of connectors.

10. The extendable enclosure of claim 8, wherein the second enclosure further comprises a mating feature operable to mate the second enclosure to the first enclosure.

11. The extendable enclosure of claim 10, wherein the mating feature comprises at least one of:

rotating latches operable to mate the second enclosure to the first enclosure;

guide pins operable to align second enclosure to the first enclosure; and backplane alignment guides operable to align the backplane extension connector of the second enclosure to the backplane connector of the first enclosure.

12. The extendable enclosure of claim 11, further comprising:

a pluggable board operable to plug into the midplane connector and having a plurality of connectors, the plurality of connectors including at least one of a plurality of different types of connectors.

13. The extendable enclosure of claim 8, wherein circuit cards mounted in the first enclosure and circuit cards mounted in the second enclosure are operable to all be managed as a single entity.

* * * * *